(12) United States Patent
Jia et al.

(10) Patent No.: US 10,885,990 B1
(45) Date of Patent: Jan. 5, 2021

(54) METHOD OF PERFORMING PROGRAMMING OPERATION AND RELATED MEMORY DEVICE

(71) Applicant: Yangtze Memory Technologies Co., Ltd., Wuhan (CN)

(72) Inventors: Xinlei Jia, Wuhan (CN); Shan Li, Wuhan (CN); Kaiwei Li, Wuhan (CN); Jianquan Jia, Wuhan (CN); Lei Jin, Wuhan (CN); Kaikai You, Wuhan (CN); Ying Cui, Wuhan (CN); Yali Song, Wuhan (CN); Wei Hou, Wuhan (CN); Zhiyu Wang, Wuhan (CN); Hongtao Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/726,947

(22) Filed: Dec. 26, 2019

Related U.S. Application Data

(63) Continuation of application No. PCT/CN2019/117821, filed on Nov. 13, 2019.

(51) Int. Cl.
| | |
|---|---|
| *G11C 7/00* | (2006.01) |
| *G11C 16/34* | (2006.01) |
| *G11C 16/10* | (2006.01) |
| *G11C 16/28* | (2006.01) |
| *G11C 16/24* | (2006.01) |
| *G11C 16/08* | (2006.01) |

(52) U.S. Cl.
CPC .......... *G11C 16/3427* (2013.01); *G11C 16/08* (2013.01); *G11C 16/10* (2013.01); *G11C 16/24* (2013.01); *G11C 16/28* (2013.01)

(58) Field of Classification Search
CPC ....... G11C 29/50; G11C 11/401; G11C 29/02; G11C 29/34
USPC ................................ 365/203, 185.18, 189.16
See application file for complete search history.

(56) References Cited

U.S. PATENT DOCUMENTS

| | | | |
|---|---|---|---|
| 2008/0135912 A1 | 6/2008 | Lee | |
| 2009/0168536 A1 | 7/2009 | Chung | |
| 2010/0054036 A1* | 3/2010 | Lee ..................... | G11C 16/0483 365/185.03 |
| 2014/0112075 A1* | 4/2014 | Dunga ............... | G11C 16/0483 365/185.17 |

FOREIGN PATENT DOCUMENTS

| | | |
|---|---|---|
| CN | 105938723 A | 9/2016 |
| CN | 107507646 A | 12/2017 |
| CN | 108028070 A | 5/2018 |
| CN | 109817262 A | 5/2019 |
| CN | 110428859 A | 11/2019 |
| TW | 201351418 A | 12/2013 |
| WO | 2019/070429 A1 | 4/2019 |

* cited by examiner

*Primary Examiner* — Son T Dinh
(74) *Attorney, Agent, or Firm* — Winston Hsu

(57) ABSTRACT

A method of performing a programming operation to a three dimensional (3D) NAND memory device is disclosed. The method makes residual electrons trapped in storage regions of middle dummy memory cells of the unselected string of the 3D NAND memory device to be removed during the pre-charging phase, so as to reduce program disturb to the selected string which neighbors the unselected string.

20 Claims, 6 Drawing Sheets

METHOD OF PERFORMING PROGRAMMING OPERATION AND RELATED MEMORY DEVICE

CROSS REFERENCE TO RELATED APPLICATIONS

This is a continuation application of International Application No. PCT/CN 2019/117821 filed on Nov. 13, 2019, which is incorporated herein by reference in its entirety.

BACKGROUND OF THE INVENTION

1. Field of the Invention

The present invention relates to a method of performing a programming operation, and more particularly, to a method of performing a programming operation to a three dimensional (3D) NAND memory device.

2. Description of the Prior Art

Semiconductor memories are widely used in various electronic devices such as cellular phones, digital cameras, personal digital assistants, medical electronic devices, mobile computing devices and non-mobile computing devices. A nonvolatile memory allows information to be stored and retained. Examples of the nonvolatile memory comprises a flash memory (e.g., NAND type and NOR type flash memory) and electrically erasable programmable read only memory (Electrically Erasable Programmable Read-Only Memory, EEPROM).

Memory cells in some NAND architectures have a charging storage region that holds charging to program the memory cells. One example of a charging storage region is a floating gate. When programming an EEPROM or flash memory device, such as a NAND flash memory device, typically a program voltage is applied to the control gate (or selected word line) and the bit line is grounded. Electrons from the channel are injected into the charging storage region. When electrons accumulate in the charging storage region, the charging storage region becomes negatively charging and the threshold voltage of the memory cell is raised so that the memory cell is in a programmed state.

Applicant notices that, during the pre-charging phase, residual electrons may be trapped in storage regions of dummy cells of an unselected string to cause program disturb to the selected memory cell of the selected string which is neighboring to the unselected string. For example, during a boosting/programming phase, the residual electrons trapped in the unselected string may reduce the channel potential corresponding to the selected memory cell of the selected string to cause program disturb.

Therefore, there is a need to provide a method and memory device to reduce program disturb.

SUMMARY OF THE INVENTION

It is therefore an objective of the present invention to provide a method and related memory device to reduce program disturb.

The present invention discloses a method of performing a programming operation to a three dimensional (3D) NAND memory device. The method includes during a pre-charging phase of the programming operation, turning on a first portion of a channel of an unselected string of the 3D NAND memory device, wherein the first portion is located vertically below a selected memory cell of the unselected string and above a plurality of dummy cells of the unselected string; during the pre-charging phase, turning on a second portion of the channel of the unselected string after the first portion of the channel of the unselected string has been turned off, wherein the second portion is located vertically above the selected memory cell and the first portion; and during a boosting phase of the programming operation, turning off a third portion of the channel of the unselected string when the first portion and the second portion are turned on, wherein the third portion is located vertically below the second portion and above first portion and the selected memory cell.

The present invention further discloses a three dimensional (3D) NAND memory device including a plurality of bit lines; a plurality of word lines; a memory array comprising a plurality of strings; a word line driver coupled to the memory array, and configured to generate a plurality of voltages applied to the plurality of word lines of the memory array according to a plurality of control signals; a control circuit configured to generate the plurality of control signals according to a process of performing a programming operation. The process includes steps of the method of performing a programming operation to 3D NAND memory device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
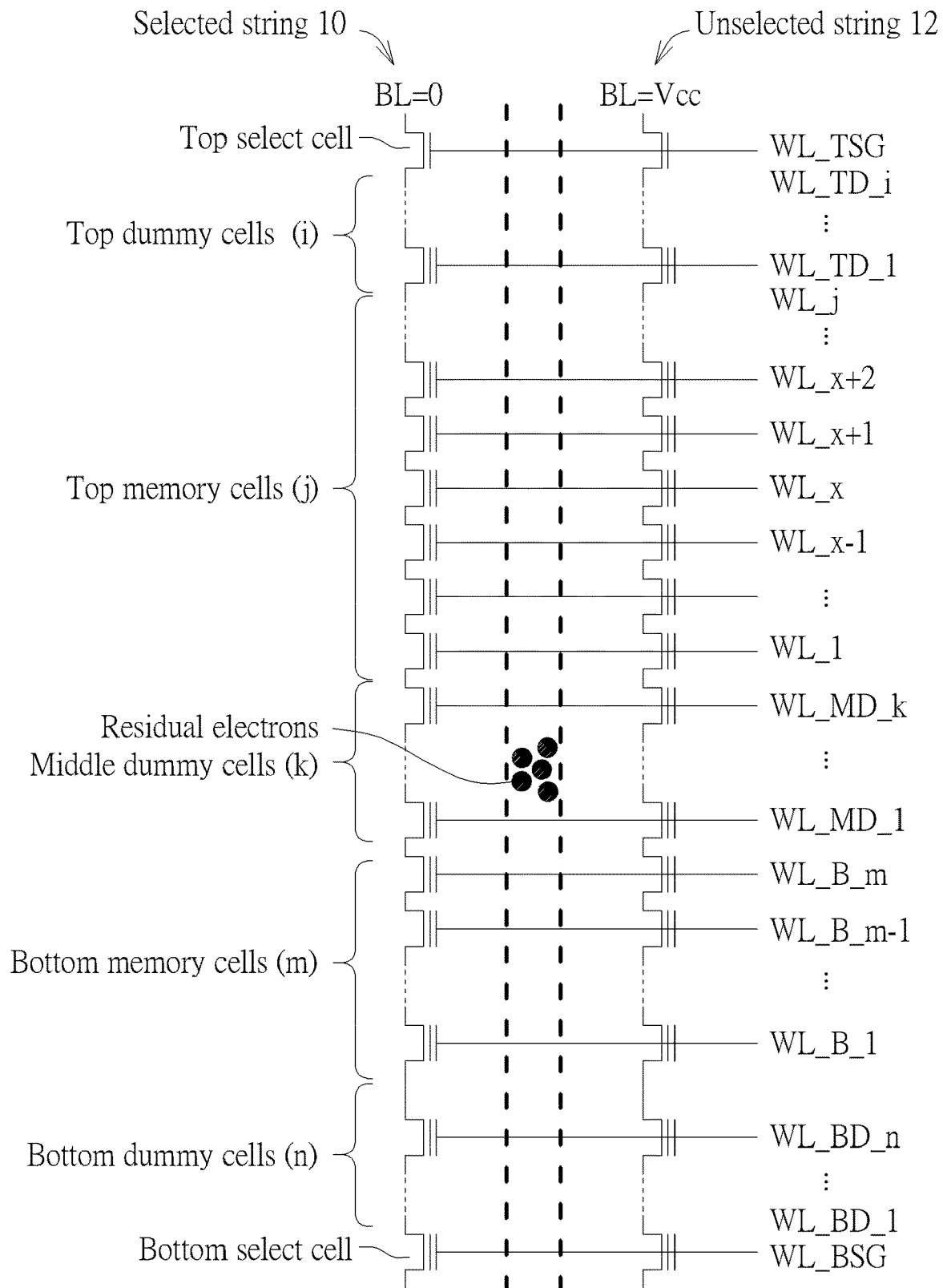
FIG. 1 illustrates residual electrons remained in a channel of an unselected string which neighbors a selected string.

FIG. 1 illustrates residual electrons remained in a channel of an unselected string 12 which neighbors a selected string 10. A memory array may include the selected string 10 and the unselected string 12. The memory array may be a three-dimensional NAND flash memory array including a plurality of bi-lines, a plurality of word lines, and a plurality of strings, wherein each of the strings extends vertically, and includes a plurality of memory cells formed in a plurality of horizontal layers.

The strings 10 and 12 are structurally identical; for example, each of the strings 10 and 12 may include a top select cell, a plurality of top dummy cells, a plurality of top memory cells, a plurality of middle dummy cells, a plurality of bottom memory cells, a plurality of bottom dummy cells, and a bottom select cell, wherein the cells included in the string are serially connected. The plurality of top dummy cells includes i cells, the plurality of top memory cells includes j cells, the plurality of middle dummy cells includes k cells, the plurality of bottom memory cells includes m cells, and the plurality of bottom dummy cells includes n cells, wherein i, j, k, m and n are integers greater than 1.

A word line WL_TSG is connected to gates of the top select cells of the strings 10 and 12. A plurality of word lines WL_TD_1 to WL_TD_i is connected to a plurality of gates of the plurality of top dummy cells. A plurality of word lines WL_1 to WL_j is connected to a plurality of gates of the plurality of top memory cells of the strings 10 and 12. One of the plurality of word lines WL_1 to WL_j is a selected word line WL_x connected to a selected memory cell of the selected string 10 and a memory cell that is horizontally neighboring to the selected memory cell. One of the plurality of word lines WL_1 to WL_j is a first neighboring word line WL_x+1 connected to a first neighboring memory cell that is vertically neighboring to the selected memory cell of the selected string 10. One of the plurality of word lines WL_1 to WL_j is a second neighboring word line WL_x+2 connected to a second neighboring memory cell that is vertically neighboring to the first neighboring memory cell of the selected string 10.

A plurality of word lines WL_MD_1 to WL_MD_k is connected to a plurality of gates of the plurality of middle dummy cells of the strings 10 and 12. A plurality of word lines WL_B_1 to WL_B_m is connected to a plurality of gates of the plurality of bottom dummy cells of the strings 10 and 12. A plurality of word lines WL_BD_1 to WL_BD_n is connected to a plurality of gates of the plurality of bottom dummy cells of the strings 10 and 12. A word line WL_BSG is connected to gates of the bottom select cells of the strings 10 and 12.

A drain of the top select cell is connected to a bit-line (BL), and the bit line of the selected string 10 is always applied with zero (ground) voltage during a programming operation, while the bit line of the unselected string 12 is applied with a system voltage pulse Vcc during a programming operation. During a pre-charging phase of the programming operation, a certain amount of residual electrons may be trapped in storage regions of the plurality of middle dummy cells corresponding to the plurality of word lines WL_MD_1 to WL_MD_k of the unselected string 12 to cause program disturb to the neighboring selected string 10.

Figure 2:
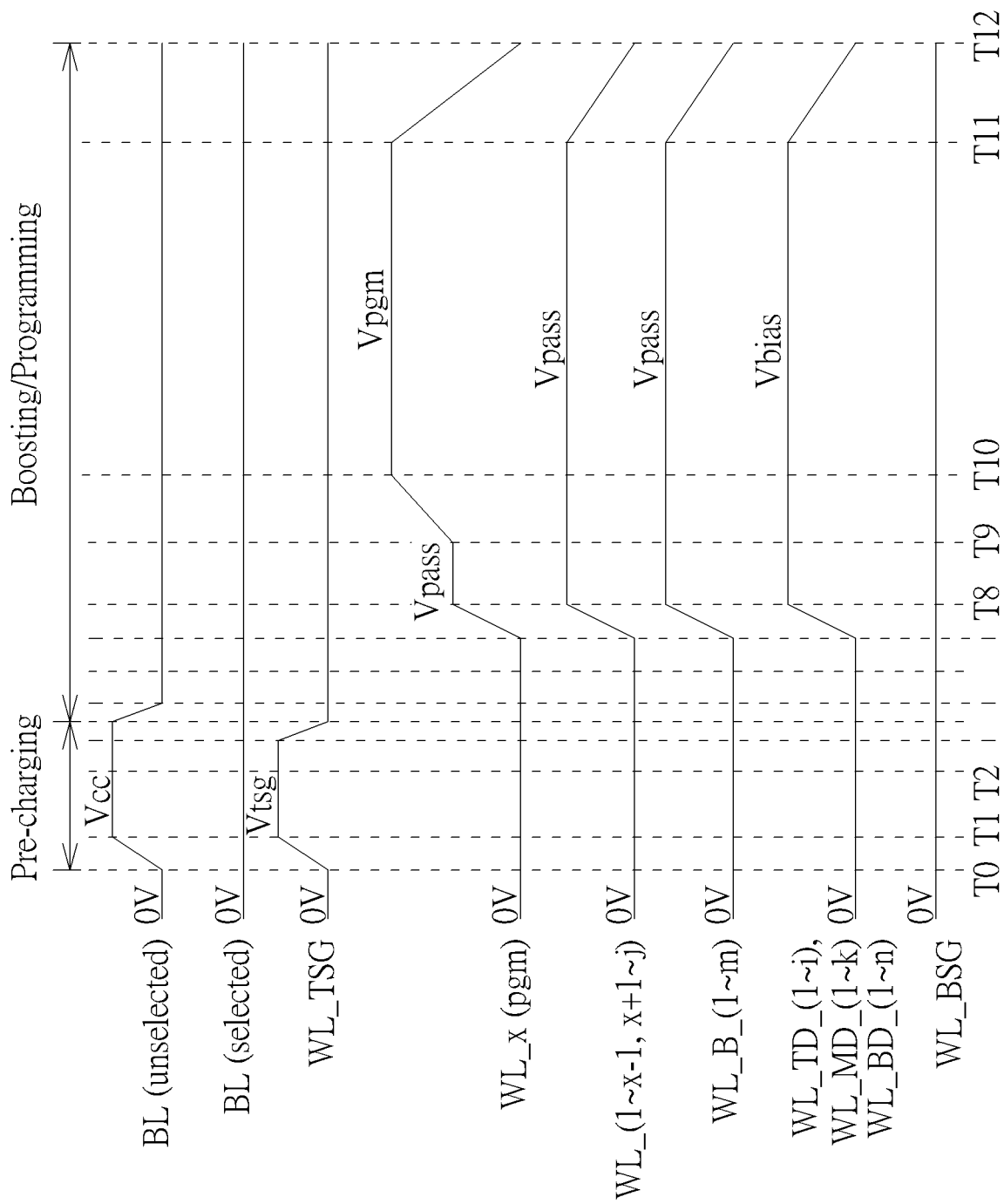
FIG. 2 is a signal diagram of a programming operation for the strings in FIG. 1.

FIG. 2 is a signal diagram of a programming operation for the strings 10 and 12 in FIG. 1. During a pre-charging phase, the voltage of the bit line of the selected string 12 increases from zero volt at time T0 to a voltage Vcc at time T4. The voltage of the word line WL_TSG increases from zero volt at time T0 to a voltage Vtsg at time T1, and the voltage of the word line WL_TSG decreases from time T3 to zero volt at time T4. The word lines WL_BSG, WL_BD_1 to WL_BD_n, WL_B_1 to WL_B_m, WL_MD_1 to WL_MD_k, WL_1 to WL_j, and WL_TD_1 to WL_TD_i are at zero volt during the pre-charging phase. One of the plurality of word lines WL_1 to WL_j is a selected word line WL_x.

During time T1 to time T2, a certain amount of residual electrons may be trapped in storage regions of the plurality of middle dummy cells corresponding to the plurality of word lines WL_MD_1 to WL_MD_k of the unselected string 12 to cause program disturb to the neighboring selected string 10. For example, during a boosting phase of the unselected string 12 and a programming phase of the selected string 10, in particular from time T9 to time T10, a voltage Vpass is applied to the word lines WL_B_1 to WL_B_m and WL_1 to WL_j corresponding to the memory cells to increase the channel potential of the memory cells, and a voltage Vbias is applied to the word lines WL_BD_1 to WL_BD_n, WL_MD_1 to WL_MD_k and WL_TD_1 to WL_TD_i corresponding to the dummy cells to increase the channel potential of the dummy cells. During time T10 to time T11, a programming voltage Vpgm is applied to the selected word line WL_x. However, the residual electrons at the middle dummy cells of the unselected string 12 may induce a lateral field to the neighboring selected string 10 to cause program disturb. For example, the channel potential corresponding to the selected memory cell of the selected string 10 is decreased due to the lateral field induced by the residual electrons.

Figure 3:
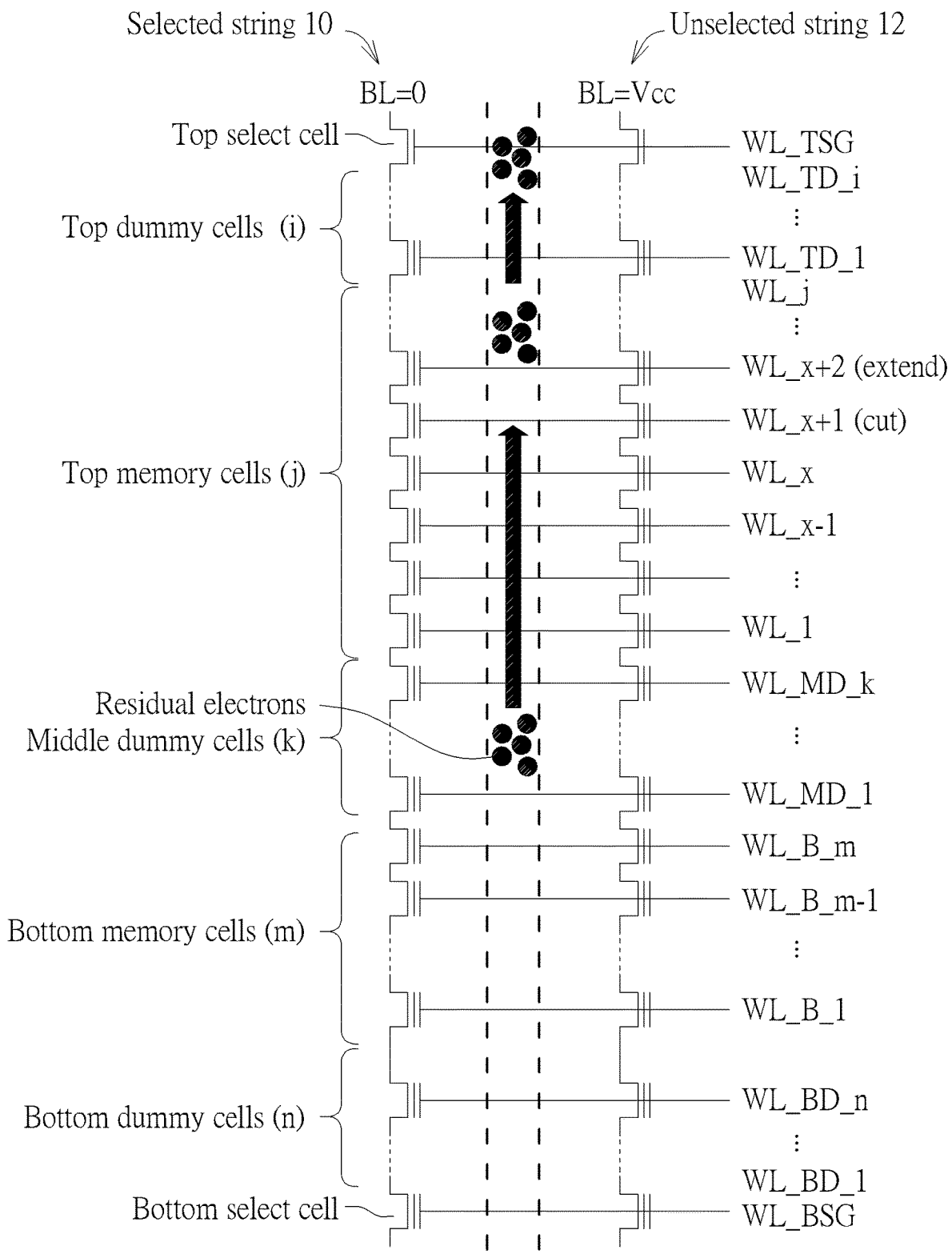
FIG. 3 illustrates movement of residual electrons remained in a channel of an unselected string which neighbors a selected string according to an embodiment of the present invention.

To reduce program disturb, please refer to FIG. 3, which illustrates movement of residual electrons remained in a channel of an unselected string 12 which neighbors a selected string 10 according to an embodiment of the present invention. In order to reduce the residual electrons to avoid program disturb, during the pre-charging phase, the word lines WL_1 to WL_x−1 are applied with a voltage Von to partially turn on the channel of the unselected string 12, thereby the residual electrons can move from the middle dummy cells to the top memory cells along the partially turned-on channel. Further, during the pre-charging phase after the word lines WL_1 to WL_x−1 are applied with zero volt to partially turn off the channel of the unselected string 12, the word line WL_x+2 is applied with the voltage Vpass to partially turn on the channel of the unselected string 12, thereby the residual electrons can move from the top memory cells to the top dummy cells along the partially turned-on channel. Finally, during the boosting/programming phase, the word line WL_x+1 is applied with a voltage Vcut to weakly turn off the top memory cell corresponding to the word line WL_x+1, thereby the channel of the unselected string 12 is partially turn off to prevent the residual electrons from moving back to the top memory cells which are below the top memory cell corresponding to the word line WL_x+1. As a result, the residual electrons can be removed from the plurality of middle dummy cells to avoid program disturb.

Figure 4:
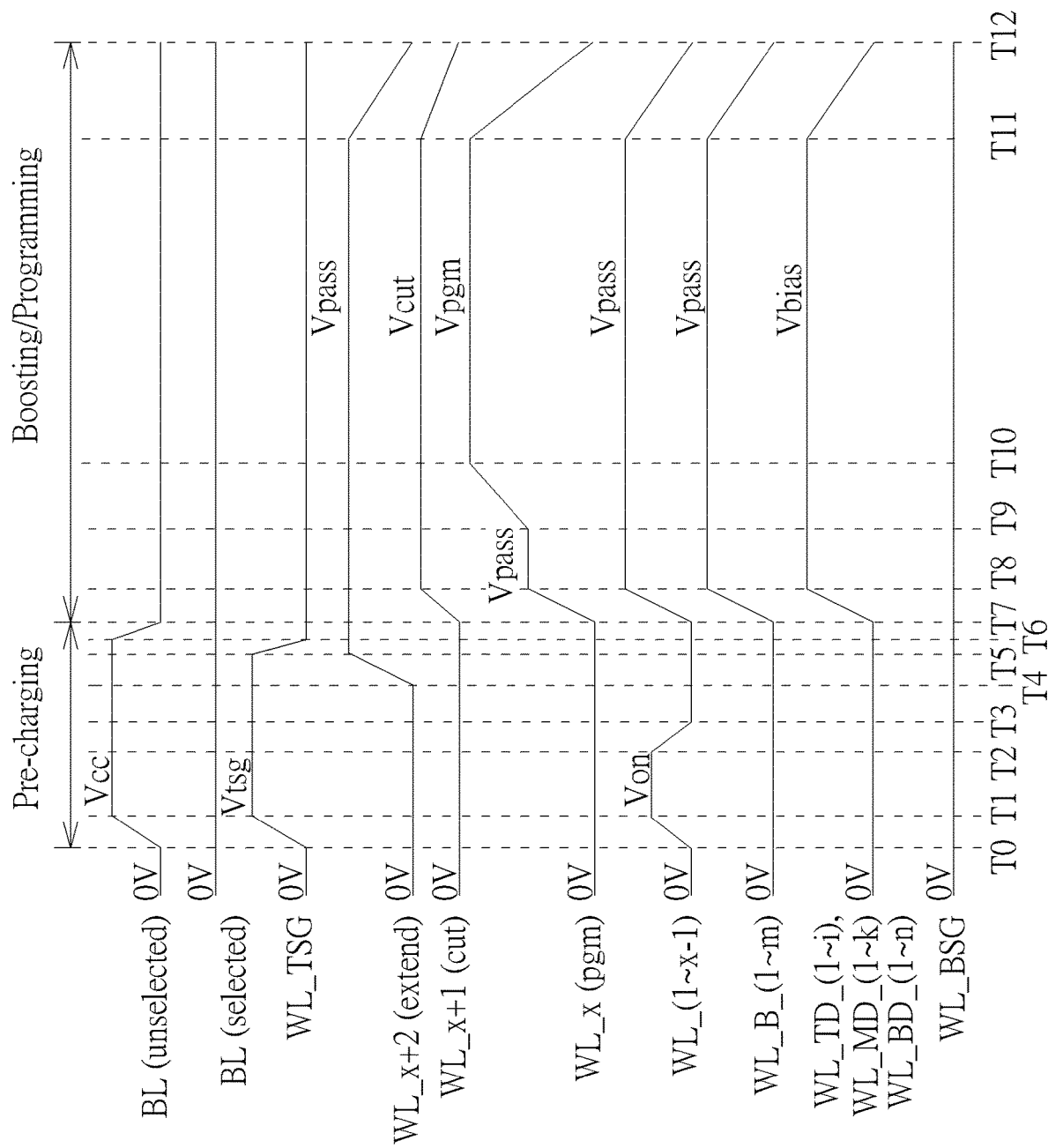
FIG. 4 is a signal diagram of a programming operation for the strings in FIG. 3.

FIG. 4 is a signal diagram of a programming operation for the strings 10 and 12 in FIG. 3. In detail, the pre-charging phase begins at time T0 and ends at time T7. A voltage of the bit line of the unselected string 12 increases from zero volt at time T0 to a voltage Vcc at time T1, the voltage Vcc is applied to the bit line of the unselected string 12 from time T1 to time T6, and the voltage of the bit line of the unselected string 12 decreases from the voltage Vcc at time T6 to zero volt at time T7. The bit line of the selected string 10 is always applied with zero volt during the programming operation. A voltage of the word line WL_TSG increases from zero volt at time T0 to a voltage Vtsg at time T1, the voltage Vtsg is applied to the word line WL_TSG from time T1 to time T5, and the voltage of the word line WL_TSG decreases from the voltage Vtsg at time T5 to zero volt at time T6 when the pre-charging phase is about to end. Voltages of the word lines WL_x+2, WL_x+1, WL_x, WL_B_1 to WL_B_m, WL_TD_1 to WL_TD_i, WL_MD_1 to WL_MD_k and WL_BD_1 to WL_BD_n are always applied with zero volt during the programming operation.

From time T1 to time T2, a voltage Von is applied to the word lines WL_1 to WL_x−1 to partially turn on the channel at the top memory cells which are located below the selected memory cell. Therefore, the residual electrons trapped at the storage regions of the plurality of middle dummy cells of the unselected string 12 can move toward the top memory cells corresponding to the word lines WL_1 to WL_x−1 when they are attracted by the voltage potential provided by the voltage Von. From time T2 to time T3, the voltage of the word lines WL_1 to WL_x−1 decreases from the voltage Von to zero volt until the pre-charging phase ends, to turn off the channel of the unselected string 12 at the top memory cells corresponding to the word lines WL_1 to WL_x−1.

A voltage of the word line WL_x+2 corresponding to the second neighboring memory cell increases from zero volt at time T4 to a voltage Vpass at time T5 to partially turn on the channel at the second neighboring memory cell of the unselected string 12. Therefore, the residual electrons at the top memory cells corresponding to the word lines WL_1 to WL_x−1 can move to the second neighboring memory cell corresponding to the word line WL_x+2 when they are attracted by the voltage potential provided by the voltage Vpass. Note that the voltage Vpass is applied to the word line WL_x+2 from time T5 at the pre-charging phase to time T11 at the boosting phase; from another point of view, the second neighboring memory cell corresponding to the word line WL_x+2 is turned on prior to the rest of the plurality of word lines WL_1 to WL_x+1 and WL_x+3 to WL_j to boost the channel potential corresponding to the word line WL_x+2 before entering the boosting/programming phase.

Note that the pre-charging phase in FIG. 2 begins at time T0 and ends at time T4, while the pre-charging phase in FIG. 4 begins at time T0 and ends at time T7. The pre-charging phase of the present invention is extended to allow the residual electrons to discharge from the bit line during the pre-charging phase.

The pre-charging phase ends at time T7, the boosting phase of the unselected string 12 and the programming phase of the selected string 10 begin at time T7 and end at time T12.

In detail, the voltage of the word line WL_x+1 corresponding to the first neighboring memory cell increases from zero volt at time T7 to a voltage Vcut at time T8, the voltage Vcut is applied to the word line WL_x+1 from time T8 to T11, and the voltage of the word line WL_x+1 decreases from the voltage Vcut at time T11 to zero volt at time T12. Voltages of the word lines WL_1 to WL_x−1, WL_x, WL_B_1 to WL_B_m increase from zero volt at time T7 to the voltage Vpass at time T8, the voltage Vpass is applied to the word lines WL_1 to WL_x−1, WL_x, WL_B_1 to WL_B_m from time T8 to time T11, and the voltages of the word lines WL_1 to WL_x−1, WL_x, WL_B_1 to WL_B_m decrease from the voltage Vcut at time T11 to zero volt at time T12. Voltages of the word lines WL_TD_1 to WL_TD_i, WL_MD_1 to WL_MD_k and WL_BD_1 to WL_BD_n increase from zero volt at time T7 to a voltage Vbias at time T8, the voltage Vbias is applied to the word lines WL_TD_1 to WL_TD_i, WL_MD_1 to WL_MD_k and WL_BD_1 to WL_BD_n from time T8 to time T11, and the voltages of the word lines WL_TD_1 to WL_TD_i, WL_MD_1 to WL_MD_k and WL_BD_1 to WL_BD_n decrease from the voltage Vcut at time T11 to zero volt at time T12.

During the boosting phase of the unselected string 12, the word line WL_x+2 corresponding to the second neighboring memory cell is applied with the voltage Vpass (T8 to T11), the word line WL_x+1 corresponding to the first neighboring memory cell is applied with the voltage Vcut (T8 to T11), and the word line WL_x corresponding to the selected memory cell is applied with the voltage Vpass (T8 to T9) and a voltage Vpgm (T10 to T11), wherein the voltage Vcut is smaller than the voltages Vpass and Vpgm. Therefore, the first neighboring memory cell is weakly turned off by the voltage Vcut, thereby the channel of the unselected string 12 is cut by the first neighboring memory cell, and memory cells located above the first neighboring memory cell are isolated from the memory cells below the first neighboring memory cell. As a result, the residual electrons can be discharged through the bit line of the unselected string 12, and the first neighboring memory cell which is weakly turned off to prevent the residual electrons from attracted by the voltage potential provided by the voltage Vpass or Vpgm.

During the boosting phase (T8 to T11) of the unselected string 12, the channel potential of the unselected string 12 is boosted by applying the voltage Vpass to the word lines corresponding to the memory cells and applying the voltage Vbias to the word lines corresponding to the dummy cells, which prevents the memory cell of the unselected string 12 corresponding to the selected word line WL_x from unintentionally programmed by the voltage Vpgm.

During the programming phase of the selected string 10, the channel potential corresponding to the selected memory cell is boosted by applying the voltage Vpass from time T8 to time T9. The voltage Vpgm is applied to the selected word line WL_x corresponding to the selected memory cell of the selected string 10 to perform a programming operation from time T10 to time T11.

Finally, the boosting phase and the programming phase are about to end from time T11, and all the bit lines and all the word lines decrease to zero volt at time T12 when the boosting phase and the programming phase end.

As a result, the residual electrons can be removed from the unselected string 12 during the pre-charging phase, so as to reduce program disturb to the neighboring selected string 10 during the boosting/programming phase.

Figure 5:
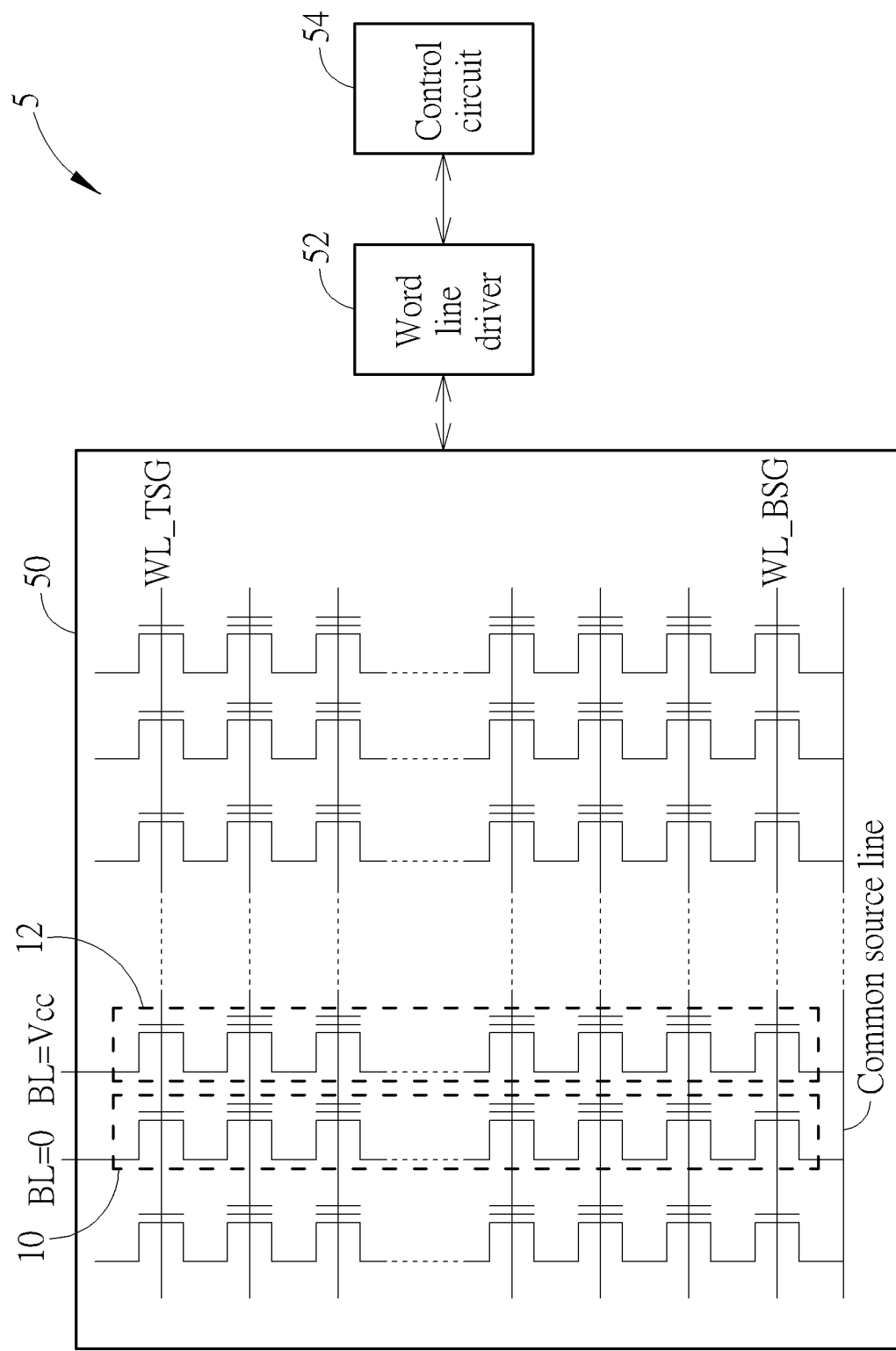
FIG. 5 is a functional block diagram of a memory device according to an embodiment of the present invention.

FIG. 5 is a functional block diagram of a memory device 5 according to an embodiment of the present invention. The memory device 5 includes a memory array 50, a word line driver 52 and a control circuit 54. The memory device 5 may be a three-dimensional NAND flash memory device. The memory array 5 includes a plurality of bit lines (BL), a plurality of word lines and a plurality of strings (e.g., the strings 10 and 12 in FIG. 3). Each string includes a plurality of memory cells and a plurality of dummy cell, wherein a plurality of memory cells and the plurality of dummy cell are connected in series and extend vertically above a substrate (not shown). The control circuit 54 is configured to generate a plurality of control signals to the word line driver 52 to perform a programming operation. The word line driver 52 is coupled to the control circuit 54 and the memory array 50, and configured to generate a plurality of voltages applied to the plurality of word lines of the memory array 50 according to the plurality of control signals generated by the control circuit 54.

Figure 6:
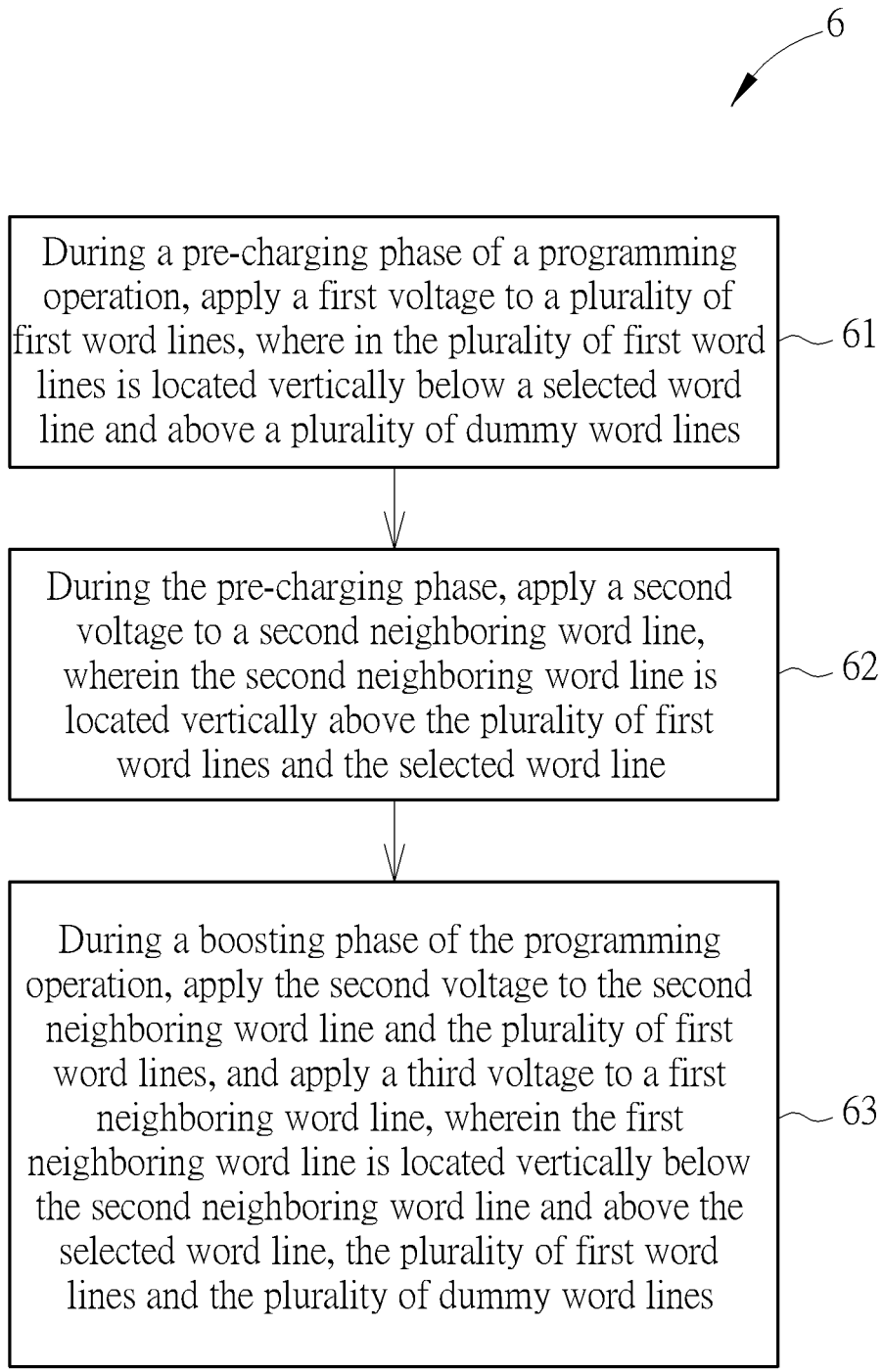
FIG. 6 is a flowchart of a process of programming operation for the strings in FIG. 3 according to an embodiment of the present invention.

FIG. 6 is a flowchart of a process 6 of programming operation for the strings in FIG. 3 according to an embodiment of the present invention. The process 6 may be performed by the control circuit 54, and include the following steps.

Step 61: During a pre-charging phase of a programming operation, apply a first voltage to a plurality of first word lines, where in the plurality of first word lines is located vertically below a selected word line and above a plurality of dummy word lines.

Step 62: During the pre-charging phase, apply a second voltage to a second neighboring word line, wherein the second neighboring word line is located vertically above the plurality of first word lines and the selected word line.

Step 63: During a boosting phase of the programming operation, apply the second voltage to the second neighboring word line and the plurality of first word lines, and apply a third voltage to a first neighboring word line, wherein the first neighboring word line is located vertically below the second neighboring word line and above the selected word line, the plurality of first word lines and the plurality of dummy word lines.

In Step 61, during the pre-charging phase of the programming operation, the control circuit 54 is configured to apply a first voltage (e.g., Von) to a plurality of first word lines (e.g., WL_1 to WL_x−1), where in the plurality of first word lines (e.g., WL_1 to WL_x−1) is located vertically below a selected word line (e.g., WL_x) and above a plurality of dummy word lines (e.g., WL_MD_1 to WL_MD_k). Therefore, the residual electrons trapped in the storage regions of the plurality of middle dummy cells can move upward to the top memory cells corresponding to the word lines WL_1 to WL_x−1.

In Step 62, during the pre-charging phase, the control circuit 54 is configured to apply a second voltage (e.g., Vpass) to a second neighboring word line (e.g., WL_x+2), wherein the second neighboring word line (e.g., WL_x+2) is located vertically above the plurality of first word lines (e.g., WL_1 to WL_x−1) and the selected word line (e.g., WL_x). Therefore, the residual electrons at the top memory cells corresponding to the word lines WL_1 to WL_x−1 can further move to the second neighboring memory cell corresponding to the second neighboring word line WL_x+2.

In Step 63, during the boosting phase of the programming operation, the control circuit 54 is configured to apply the second voltage (e.g., Vpass) to the second neighboring word line (e.g., WL_x+2) and the plurality of first word lines, and apply a third voltage (e.g., Vcut) to a first neighboring word line (e.g., WL_x+1), wherein the first neighboring word line (e.g., WL_x+1) is located vertically below the second neighboring word line (e.g., WL_x+2) and above the selected word line (e.g., WL_x), the plurality of first word lines (e.g., WL_1 to WL_x−1) and the plurality of dummy word lines (e.g., WL_MD_1 to WL_MD_k). Therefore, since the third voltage Vcut is smaller than the second voltage Vpass, the channel of the unselected string 12 is partially turned off to prevent the residual electrons from moving back to the top memory cells which are below the top memory cell corresponding to the word line WL_x+1. As a result, the residual electrons can be removed from the unselected string 12 to reduce program disturb to the neighboring selected string 10.

To sum up, the present invention provides a method of programming operation to remove residual electrons trapped in storage regions of middle dummy memory cells of the unselected string during the pre-charging phase, so as to reduce program disturb to the selected string which neighbors the unselected string.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of performing a programming operation to a three dimensional (3D) NAND memory device, comprising:
   during a pre-charging phase of the programming operation, applying a first voltage to a plurality of first word lines of the 3D NAND memory device, wherein the plurality of first word lines is located vertically below a selected word line and above a plurality of dummy word lines;
   during the pre-charging phase, applying a second voltage to a second neighboring word line of the 3D NAND memory device, wherein the second neighboring word line is located vertically above the plurality of first word lines and the selected word line; and
   during a boosting phase of the programming operation, applying the second voltage to the second neighboring word line and the plurality of first word lines, and applying a third voltage to a first neighboring word line of the 3D NAND memory device, wherein the first neighboring word line is located vertically below the second neighboring word line and above the selected word line, the plurality of first word lines and the plurality of dummy word lines.

2. The method of claim 1, wherein during the pre-charging phase of the programming operation, applying a first voltage to a plurality of first word lines of the 3D NAND memory device comprises:
   increasing voltages of the plurality of first word lines from zero volt when the pre-charging phase begins;
   applying the first voltage to the plurality of first word lines from a first time to a second time; and
   decreasing the voltages of the plurality of first word lines from the first voltage at the second time to zero volt at a third time until the pre-charging phase ends.

3. The method of claim 2, further comprising:
   applying zero volt to the plurality of word lines from the third time to a seventh time when the pre-charging phase ends;
   increasing the voltages of the plurality of word lines from zero volt at the seventh time to the second voltage at an eighth time;
   applying the second voltage to the plurality of first word lines from the eighth time to an eleventh time; and
   decreasing the voltages of the plurality of word lines from the second voltage at the eleventh time to zero volt at a twelfth time;
   wherein the boosting phase begins at the seventh time and ends at the twelfth time.

4. The method of claim 1, wherein during the pre-charging phase, applying the second voltage to the second neighboring word line of the 3D NAND memory device comprises:
   increasing a voltage of the second neighboring word line from zero volt at a fourth time to the second voltage at a fifth time; and
   applying the second voltage to the second neighboring word line from the fifth time to a seventh time;
   wherein the pre-charging phase ends and the boosting phase begins at the seventh time.

5. The method of claim 4, wherein during the boosting phase, the method further comprises:
   applying the second voltage to the second neighboring word line from the seventh time to an eleventh time; and
   decreasing the voltage of the second neighboring word line from the second voltage at the eleventh time to zero volt a twelfth time;
   wherein the boosting phase ends at the twelfth time.

6. The method of claim 1, wherein applying the third voltage to the first neighboring word line of the 3D NAND memory device comprises:
   applying zero volt to the first neighboring word line during the pre-charging phase;
   increasing a voltage of a first neighboring word line from zero volt at a seventh time to a third voltage at an eighth time;

applying the third voltage to the first neighboring word line from the eighth time to an eleventh time; and decreasing the voltage of the first neighboring word line from the third voltage at the eleventh time to zero volt at a twelfth time;

wherein the first neighboring memory cell is located vertically above the selected memory cell and below a second neighboring memory cell of the unselected string;

wherein the third voltage is smaller than the second voltage applied to a selected word line, the first portion and the second portion, and the third voltage weakly turns off the first neighboring memory cell to turn off the third portion of the channel of the unselected string.

7. The method of claim 1, further comprising:

during the pre-charging phase, applying a fourth voltage to a bit line of an unselected string of the 3D NAND memory device from a first time to a sixth time;

during the pre-charging phase, decreasing a voltage of the bit line of the unselected string from the fourth voltage at the sixth time to zero volt at a seventh time; and during the boosting phase, applying zero volt to the bit line of the unselected string from a seventh time to a twelfth time;

wherein the pre-charging phase ends and the boosting phase begins at the seventh time, and the boosting phase ends at the twelfth time.

8. The method of claim 1, further comprising:

during the pre-charging phase, applying a fifth voltage to a top select word line of the 3D NAND memory device from the first time to a fifth time, wherein the top select word line is located vertically above the second neighboring word line, the selected word line, the plurality of first word lines and the plurality of dummy word lines;

during the pre-charging phase, decreasing a voltage of the top select word line from the fifth voltage at the fifth time to zero volt at a sixth time; and applying zero volt to the top select word line from the sixth time to a twelfth time;

wherein the pre-charging phase ends at a seventh time, the boosting phase begins at the seventh time and ends at the twelfth time.

9. The method of claim 1, further comprising:

during the pre-charging phase, applying zero volt to the plurality of dummy word lines;

increasing voltages of the plurality of dummy word lines from zero volt at a seventh time to an eighth time;

applying a sixth voltage to the plurality of dummy word lines from the eighth time to an eleventh time; and decreasing the voltages of the plurality of dummy word lines from the sixth voltage at the eleventh time to zero volt at a twelfth time.

10. The method of claim 1, further comprising:

during the boosting phase, applying zero volt to a selected word line;

increasing a voltage of the selected word line from zero volt at a seventh time to a second voltage at an eighth time;

applying the second voltage to the selected word line from the eighth time to a ninth time;

increasing the voltage of the selected word line from the second voltage at the ninth time to a seventh voltage at a tenth time;

applying the seventh voltage to the selected word line from the tenth time to an eleventh time; and decreasing the voltage of the selected word line from the seventh voltage at the eleventh time to zero volt at a twelfth time.

11. A three dimensional (3D) NAND memory device comprising:

a plurality of bit lines;

a plurality of word lines;

a memory array comprising a plurality of strings;

a word line driver coupled to the memory array, and configured to generate a plurality of voltages applied to the plurality of word lines of the memory array according to a plurality of control signals;

a control circuit configured to generate the plurality of control signals according to a process of performing a programming operation, wherein the process comprises:

during a pre-charging phase of the programming operation, applying a first voltage to a plurality of first word lines of the 3D NAND memory device, wherein the plurality of first word lines is located vertically below a selected word line and above a plurality of dummy word lines;

during the pre-charging phase, applying a second voltage to a second neighboring word line of the 3D NAND memory device, wherein the second neighboring word line is located vertically above the plurality of first word lines and the selected word line; and during a boosting phase of the programming operation, applying the second voltage to the second neighboring word line and the plurality of first word lines, and applying a third voltage to a first neighboring word line of the 3D NAND memory device, wherein the first neighboring word line is located vertically below the second neighboring word line and above the selected word line, the plurality of first word lines and the plurality of dummy word lines.

12. The 3D NAND memory device of claim 11, wherein during the pre-charging phase of the programming operation, applying a first voltage to a plurality of first word lines of the 3D NAND memory device comprises:

increasing voltages of the plurality of first word lines from zero volt when the pre-charging phase begins;

applying the first voltage to the plurality of first word lines from a first time to a second time; and decreasing the voltages of the plurality of first word lines from the first voltage at the second time to zero volt at a third time until the pre-charging phase ends.

13. The 3D NAND memory device of claim 12, wherein the process comprises:

applying zero volt to the plurality of word lines from the third time to a seventh time when the pre-charging phase ends;

increasing the voltages of the plurality of word lines from zero volt at the seventh time to the second voltage at an eighth time;

applying the second voltage to the plurality of first word lines from the eighth time to an eleventh time; and decreasing the voltages of the plurality of word lines from the second voltage at the eleventh time to zero volt at a twelfth time;

wherein the boosting phase begins at the seventh time and ends at the twelfth time.

14. The 3D NAND memory device of claim 11, wherein during the pre-charging phase, applying the second voltage to the second neighboring word line of the 3D NAND memory device comprises:

increasing a voltage of the second neighboring word line from zero volt at a fourth time to the second voltage at a fifth time; and applying the second voltage to the second neighboring word line from the fifth time to a seventh time;

wherein the pre-charging phase ends and the boosting phase begins at the seventh time.

15. The 3D NAND memory device of claim 14, wherein during the boosting phase, the process comprises:

applying the second voltage to the second neighboring word line from the seventh time to an eleventh time; and decreasing the voltage of the second neighboring word line from the second voltage at the eleventh time to zero volt a twelfth time;

wherein the boosting phase ends at the twelfth time.

16. The 3D NAND memory device of claim 11, wherein applying the third voltage to the first neighboring word line of the 3D NAND memory device comprises:

applying zero volt to the first neighboring word line during the pre-charging phase;

increasing a voltage of a first neighboring word line from zero volt at a seventh time to a third voltage at an eighth time;

applying the third voltage to the first neighboring word line from the eighth time to an eleventh time; and decreasing the voltage of the first neighboring word line from the third voltage at the eleventh time to zero volt at a twelfth time;

wherein the first neighboring memory cell is located vertically above the selected memory cell and below a second neighboring memory cell of the unselected string;

wherein the third voltage is smaller than the second voltage applied to a selected word line, the first portion and the second portion, and the third voltage weakly turns off the first neighboring memory cell to turn off the third portion of the channel of the unselected string.

17. The 3D NAND memory device of claim 11, wherein the process comprises:

during the pre-charging phase, applying a fourth voltage to a bit line of an unselected string of the 3D NAND memory device from a first time to a sixth time;

during the pre-charging phase, decreasing a voltage of the bit line of the unselected string from the fourth voltage at the sixth time to zero volt at a seventh time; and during the boosting phase, applying zero volt to the bit line of the unselected string from a seventh time to a twelfth time;

wherein the pre-charging phase ends and the boosting phase begins at the seventh time, and the boosting phase ends at the twelfth time.

18. The 3D NAND memory device of claim 11, wherein the process comprises:

during the pre-charging phase, applying a fifth voltage to a top select word line of the 3D NAND memory device from the first time to a fifth time, wherein the top select word line is located vertically above the second neighboring word line, the selected word line, the plurality of first word lines and the plurality of dummy word lines;

during the pre-charging phase, decreasing a voltage of the top select word line from the fifth voltage at the fifth time to zero volt at a sixth time; and applying zero volt to the top select word line from the sixth time to a twelfth time;

wherein the pre-charging phase ends at a seventh time, the boosting phase begins at the seventh time and ends at the twelfth time.

19. The 3D NAND memory device of claim 11, wherein the process comprises:

during the pre-charging phase, applying zero volt to the plurality of dummy word lines;

increasing voltages of the plurality of dummy word lines from zero volt at a seventh time to an eighth time;

applying a sixth voltage to the plurality of dummy word lines from the eighth time to an eleventh time; and decreasing the voltages of the plurality of dummy word lines from the sixth voltage at the eleventh time to zero volt at a twelfth time.

20. The 3D NAND memory device of claim 11, wherein the process comprises:

during the boosting phase, applying zero volt to a selected word line;

increasing a voltage of the selected word line from zero volt at a seventh time to a second voltage at an eighth time;

applying the second voltage to the selected word line from the eighth time to a ninth time;

increasing the voltage of the selected word line from the second voltage at the ninth time to a seventh voltage at a tenth time;

applying the seventh voltage to the selected word line from the tenth time to an eleventh time; and decreasing the voltage of the selected word line from the seventh voltage at the eleventh time to zero volt at a twelfth time.

* * * * *